United States Patent
Gu et al.

(10) Patent No.: US 8,987,062 B2
(45) Date of Patent: Mar. 24, 2015

(54) ACTIVE THERMAL CONTROL FOR STACKED IC DEVICES

(71) Applicant: QUALCOMM Incorporated, San Diego, CA (US)

(72) Inventors: Shiqun Gu, San Diego, CA (US); Matthew Michael Nowak, San Diego, CA (US); Thomas Robert Toms, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/056,212

(22) Filed: Oct. 17, 2013

(65) Prior Publication Data

US 2014/0043756 A1   Feb. 13, 2014

Related U.S. Application Data

(62) Division of application No. 12/163,029, filed on Jun. 27, 2008, now Pat. No. 8,598,700.

(51) Int. Cl.
| | |
|---|---|
| *H01L 23/24* | (2006.01) |
| *H05K 7/20* | (2006.01) |
| *H01L 23/38* | (2006.01) |
| *H01L 25/065* | (2006.01) |

(52) U.S. Cl.
CPC ...... *H05K 7/20* (2013.01); *H01L 23/38* (2013.01); *H01L 25/0657* (2013.01); *H01L 2225/06513* (2013.01); *H01L 2225/06589* (2013.01); *H01L 2224/16145* (2013.01)
USPC .............................. 438/122; 438/689; 257/712

(58) Field of Classification Search
CPC ................ H01L 23/38; H01L 23/48

USPC .................................. 438/122, 689; 257/712
See application file for complete search history.

(56) References Cited

U.S. PATENT DOCUMENTS

| 4,983,251 A | 1/1991 | Haisma et al. |
| 5,956,569 A | 9/1999 | Shiu et al. |

(Continued)

FOREIGN PATENT DOCUMENTS

| JP | H01245549 A | 9/1989 |
| JP | 5226579 A | 9/1993 |

(Continued)

OTHER PUBLICATIONS

International Search Report & Written Opinion—PCT/US2009/048031, International Search Authority—European Patent Office—Sep. 1, 2009.

(Continued)

*Primary Examiner* — Howard Weiss
*Assistant Examiner* — Tifney Skyles
(74) *Attorney, Agent, or Firm* — Michelle S. Gallardo (57) ABSTRACT

Thermal conductivity in a stacked IC device can be improved by constructing one or more active temperature control devices within the stacked IC device. In one embodiment, the control devices are thermal electric (TE) devices, such as Peltier devices. The TE devices can then be selectively controlled to remove or add heat, as necessary, to maintain the stacked IC device within a defined temperature range. The active temperature control elements can be P-N junctions created in the stacked IC device and can serve to move the heat laterally and/or vertically, as desired.

10 Claims, 6 Drawing Sheets

(56) References Cited

U.S. PATENT DOCUMENTS

| | | |
|---|---|---|
| 6,711,904 B1 | 3/2004 | Law et al. |
| 7,022,553 B2 | 4/2006 | Ahn et al. |
| 7,250,327 B2 | 7/2007 | Sakamoto |
| 7,301,233 B2 | 11/2007 | Lee et al. |
| 7,544,883 B2 | 6/2009 | Chen et al. |
| 2004/0021139 A1 | 2/2004 | Jackson et al. |
| 2005/0085075 A1 | 4/2005 | Shimada et al. |
| 2006/0001140 A1 | 1/2006 | Lee et al. |
| 2006/0056113 A1 | 3/2006 | Fukushima et al. |
| 2006/0102223 A1 | 5/2006 | Chen et al. |
| 2006/0137732 A1 | 6/2006 | Farahani et al. |
| 2006/0145356 A1 | 7/2006 | Liu et al. |
| 2009/0321909 A1 | 12/2009 | Gu et al. |

FOREIGN PATENT DOCUMENTS

| | | |
|---|---|---|
| JP | 2002190687 A | 7/2002 |
| JP | 2003017638 A | 1/2003 |
| JP | 2008526035 A | 7/2008 |
| RU | 2299497 C2 | 5/2007 |
| WO | 0245150 A1 | 6/2002 |

OTHER PUBLICATIONS

Taiwan Search Report—TW098121679—TIPO—Sep. 4, 2013.

ACTIVE THERMAL CONTROL FOR STACKED IC DEVICES

CROSS-REFERENCE TO RELATED APPLICATIONS

The present Application for Patent is a Divisional of patent application Ser. No. 12/163,029 entitled "Active Thermal Control for Stacked IC Devices" filed Jun. 27, 2008, pending, and assigned to the assignee hereof and hereby expressly incorporated by reference herein in its entirety.

TECHNICAL FIELD

This disclosure relates to integrated circuits (ICs). More specifically, the disclosure relates to multi-tiered IC devices and even more specifically to systems and methods for active thermal control within the multi-tiered IC devices.

BACKGROUND

In IC technology there is a need to stack chips together to form multi-tiered (3-D) IC devices (also referred to as multi-layered IC devices or stacked IC devices). One challenge that arises when chips are stacked is that thermal conductivity is reduced. Thus, hot spots could exist with little ability to move the heat away from the heat source. Because of the reduced size of stacked ICs, (substrate thickness going from 100 microns to about 6-50 microns), the power density rises while lateral thermal conductivity is reduced.

One method for increasing lateral thermal conductivity is to increase the substrate thickness. This, in turn, negatively impacts the desired form factor of the stacked IC device and degrades performance.

An additional challenge exists when more than two tiers are stacked. In such situations, the stacked IC device may contain multiple layers of oxide, one between each pair of stacked tiers. Oxide, being a poor thermal conductor, adds to the heat dissipation problem.

There are several approaches for addressing the thermal conductivity issues. One approach positions a heat conducting layer between the tiers. Typically, heat conducting layers are metallic and thus could interfere with inter-layer electrical connections. Another approach uses Through Silicon Vias (TSVs) to move the heat from an inner tier to a surface tier of the stacked IC device and then remove the heat from the surface tier using traditional methods, such as positioning a high thermal conductivity material on the surface tier. Challenges arises with such a solution. For example, it is not always possible to position a TSV at the necessary location because of circuitry layout requirements in the various tiers.

Another approach is to circulate cooling material through the stacked IC device to cool the hot spots. A cooling circulation solution is costly to manufacture and, because of the moving liquid, requires a pumping mechanism and tight tolerances for liquid channels. Also, because of circuitry layout requirements, it may not be possible to "plumb" the device to channel the cooling material to the necessary location. The plumbing problem could be overcome, to some extent, by forcing cooling liquid through the substrate itself, but this method is not without a further set of problems and costs.

BRIEF SUMMARY

Thermal conductivity in stacked IC devices can be improved by constructing one or more active temperature control devices within the stacked IC device. In one embodiment, the control devices are thermal electric (TE) devices, such as Peltier devices. The TE devices can then be selectively controlled to remove or add heat as necessary to maintain the stacked IC device within a defined temperature range or otherwise bring the stacked IC device to a desired temperature. The active temperature control elements can be P-N junctions created in the stacked IC device and can serve to move the heat laterally and/or vertically as desired.

The foregoing has outlined, rather broadly, the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features, which are believed to be characteristic of the invention, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
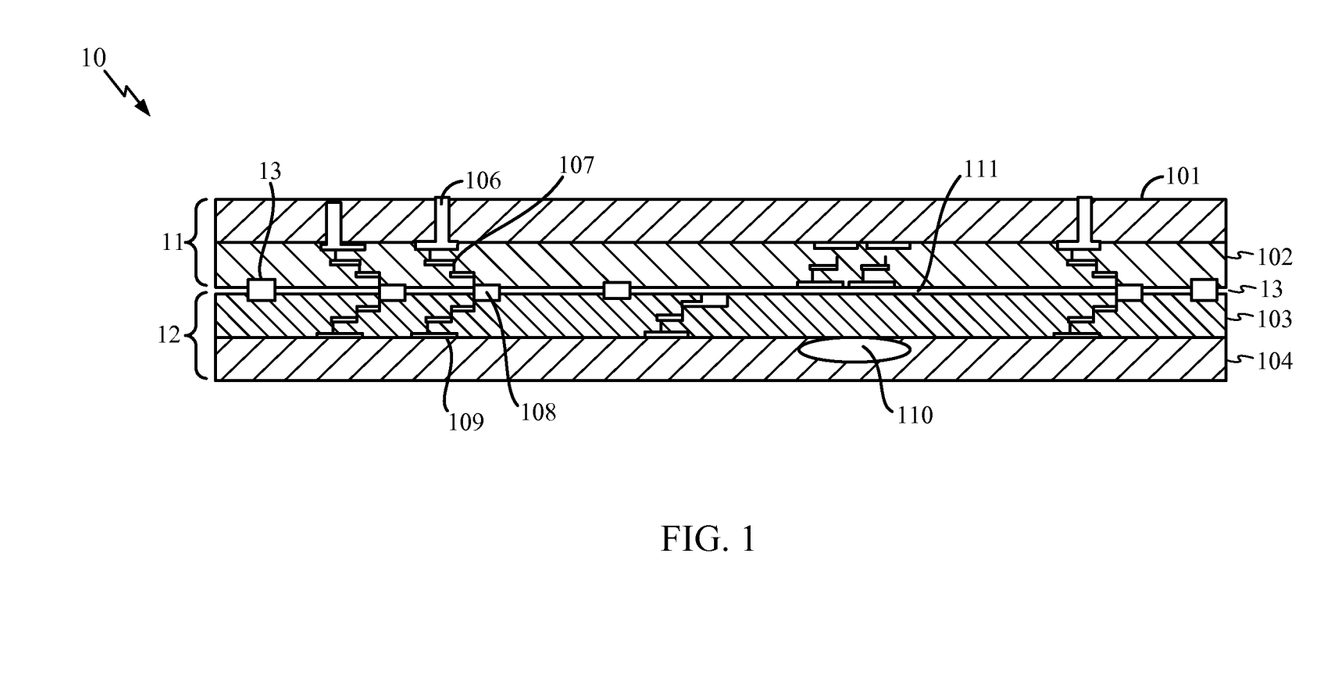
FIG. 1 is a schematic drawing of a multi-tiered IC device having a hot spot therein.

FIG. 1 is a schematic drawing of multi-tiered IC device 10 having top tier 11 and bottom tier 12. Top tier 11 has an active circuit (face) 102 and substrate (back) 101. Bottom tier 12 has active circuit (face) 103 and substrate (back) 104. Faces 102/103 contain connections 108 which serve to connect components (or terminals) such a component 109 on the respective tiers. These connections are made using connector paths, such as path 107 and a via, such as via 106

For illustrative purposes, location 110 is thermally troubled in this embodiment. That is, location 110 is a "hot spot" that exists, or could exist, from time to time in stacked IC device 10. A hot spot, in this context, means that as stacked IC device 10 is operating, the temperature of the area in and around location 110 can become undesirably higher than other portions of tier 12. Because of the stacking of tier 11 on tier 12 and, preferably, reduced thickness of each tier, the lateral heat spread in tier 12 is reduced. In addition, air gap 111 can be formed between the tiers 11, 12 thereby reducing thermal flow upward from the hot spot.

As discussed above, there are a number of reasons to include cooling functionality or structures within a stacked IC device. But there are also reasons for heating a stacked IC device, or portions thereof. For example, when designing an adaptive voltage scaling circuit, it is desirable for the entire stacked IC device to have a uniform temperature. Thus, if there are some localized areas of a tier in the stacked IC device that "run hot" (i.e., not a hot spot per se, but a localized area that operates at a warmer temperature than other areas in a tier) it might be desirable or necessary to heat the cooler areas of the tier so that the stacked IC device has a relatively constant or uniform temperature. In some situations, initialization of a stacked IC device to a required temperature is desired or important. For example, sensors may need to be hot to operate and a TE could be used to reduce initial heating time.

Additionally, selective heating and/or cooling may be required or desirable in a stacked IC device. For example, selective heating or cooling or a combination thereof may be used to even out the temperature gradients across silicon to alleviate stress caused by temperature differentials in the substrate. Also, selective temperature control can be used to allow the stacked IC device to operate, at least temporarily, in temperature environments that it otherwise would not be designed to operate in.

Figure 2:
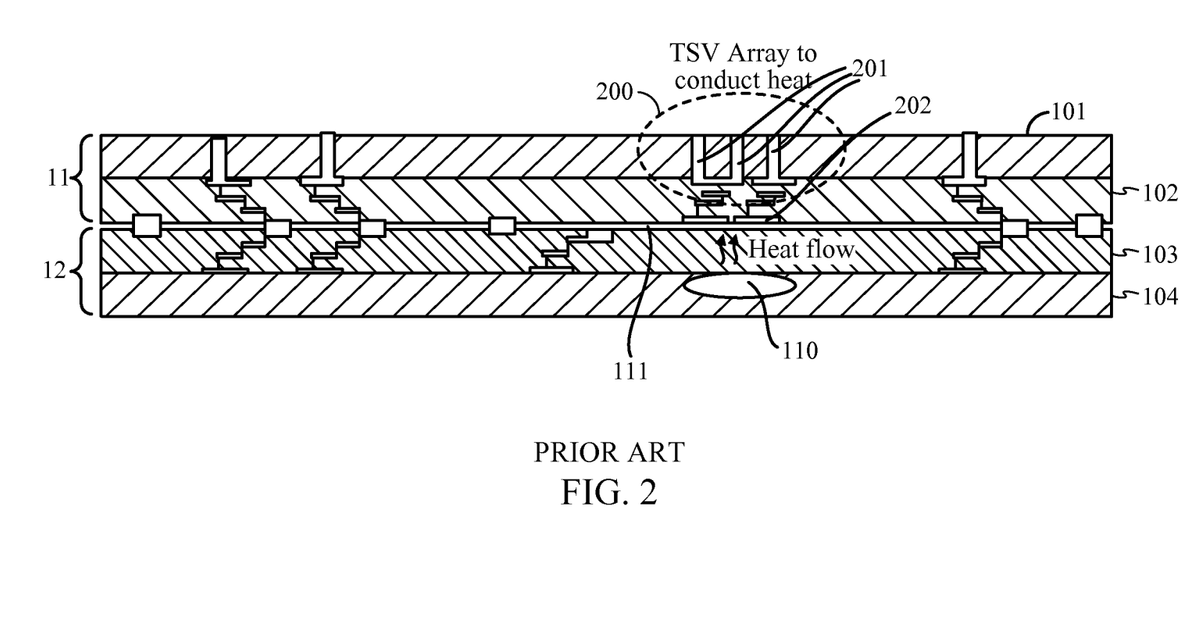
FIG. 2 shows one example of a prior art solution for relieving heat from the hot spot.

FIG. 2 shows one example of a prior art solution for relieving heat from hot spot 110. In this solution, TSV array 200 is positioned above hot spot 110 so that the heat flowing from the hot spot 110 can be conducted through face 103, across gap 111, through face 102 and out through vias 201. In addition to the thermal conductivity problems, inherent with moving the heat through the various layers and gaps, in some situations circuitry or other elements, such as element 202, can be positioned in the heat flow path thereby reducing (and sometimes eliminating) the effectiveness of the TSV array 200.

Figure 3:
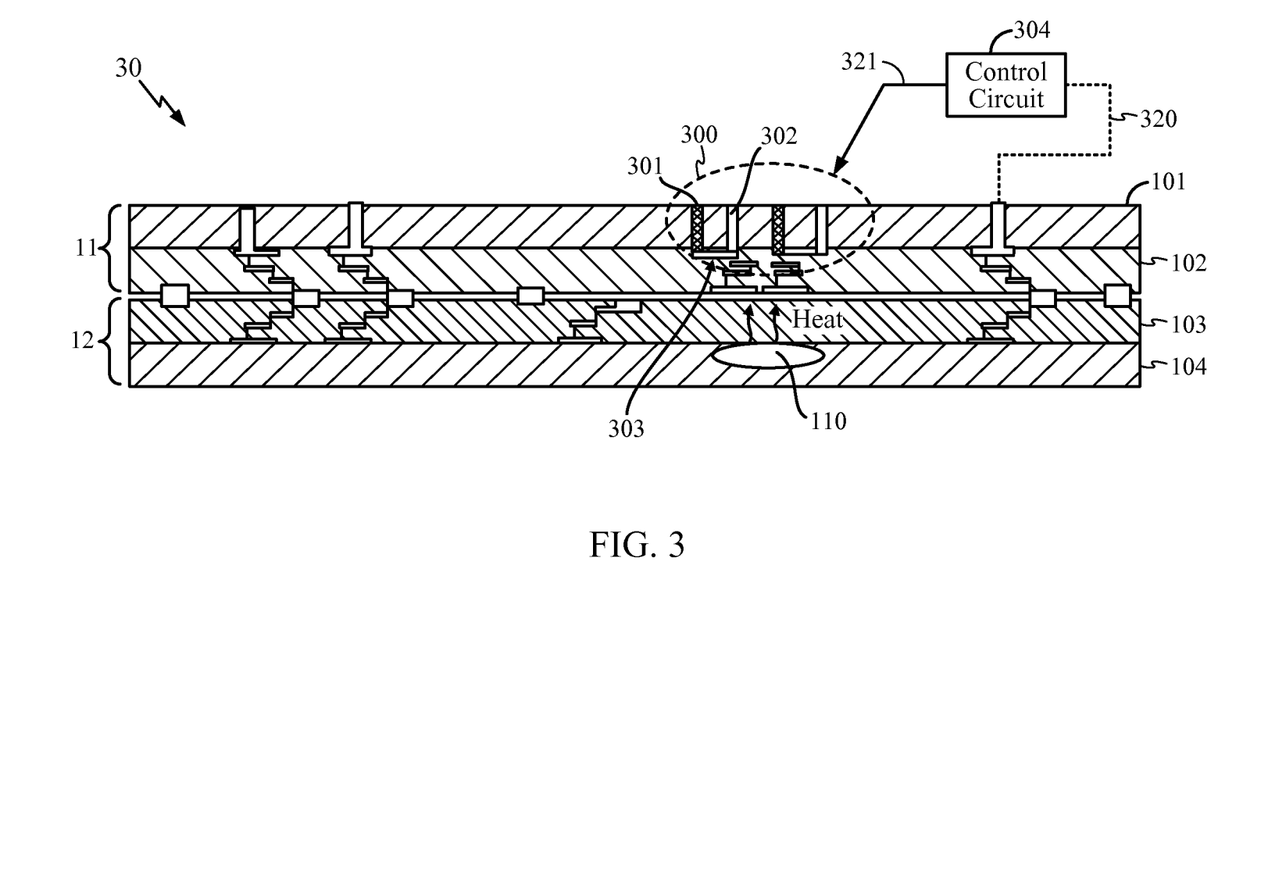
FIG. 3 shows one embodiment of a stacked IC device having active temperature control in accordance with the teachings of the invention.

FIG. 3 shows one embodiment of a stacked IC device 30 having active temperature control in accordance with the teachings of the invention. A TE device 300 includes a pair of P-N junctions. Each P-N junction includes a P-type element 301 and N type element 302, as well as a bottom conductor 303. Depending on which direction current flows through the P-N junction, the bottom conductor 303 can either attract heat or provide heat. In one embodiment, the TE device 300 is a Peltier device. Although a pair of P-N junctions are shown, the invention is not limited to such a configuration. Rather, more or fewer P-N junctions can be provided.

Control circuit 304 is used to establish the current flow direction through the P-N junction. Control circuit 304 also controls current density. Circuit 304 provides selective current control to TE device 300 via an input, such as input 321. In one embodiment, a TE device 300 operates such that a top side (top not designated with a reference number) heats while the other side, e.g., bottom 303, cools, based upon the current direction.

The thermal energy from hot spot 110 passes up through faces 103 and 102 to device 300. This thermal flow can be facilitated by constructing channels (vias) through the faces if desired. By selecting the proper current density, and current flow direction, device 300 serves to remove heat, thereby cooling the stacked IC device 30. Heat sink, or other heat transfer devices, not shown, may be located on the surface of tier 11 adjacent to TE device 300 to assist TE device 300 in heat removal from stacked IC device 30. Note that the stacked IC device 30 can have TE devices 300 provided in as many different areas as desired with some of the TE devices 300 injecting heat while others remove heat Note that while the P-N junction material is shown going all the way through the substrate of tier 11, in another embodiment, the P-N material partially fills the substrate, with the junction being formed near the bottom conductor 303. In this embodiment, the top portion of each via is filled by metallization, creating a contact within the vias.

In some embodiments, the "hot spot" can be co-located in the same layer as the cooling device thereby resulting in lateral heat displacement. In such a situation, a horizontal trench could be constructed in the substrate to laterally transfer the heat within the same substrate. A first portion of the trench would include P-type material and another portion of the trench would include N-type material.

Figure 4A:
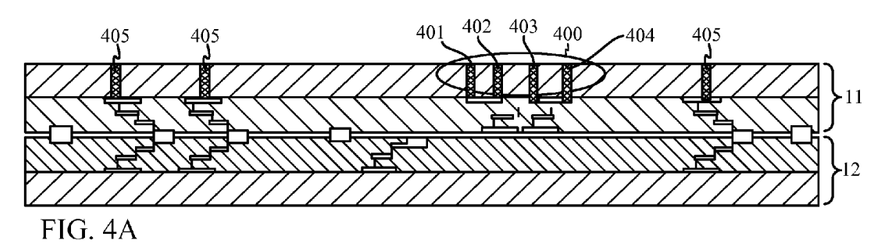
FIGS. 4A through 4G show one method of manufacturing a multi-tiered IC device having active cooling capability in accordance with the teachings of the invention.

FIGS. 4A though 4G show an exemplary method of manufacturing a multi-layered IC device having active temperature control.

FIG. 4A shows that tier 11 is stacked with respect to tier 12 and that some locations, such as locations 401-405 in the substrate of tier 11 are filled from top to bottom with sacrificial fill material. As will be seen, an active temperature control element will be constructed at location 400.

Figure 4B:
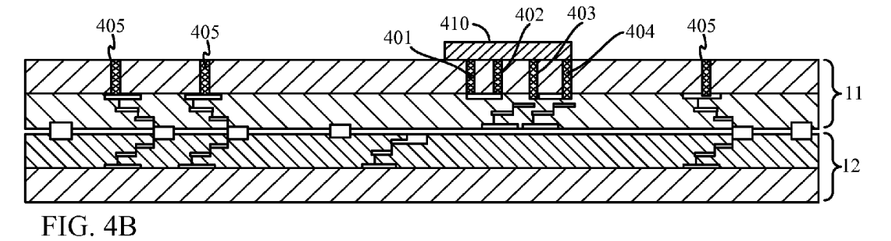

FIG. 4B shows protective material 410 covering locations 401-404 in preparation for the next step in the process. Uncovered locations 405 will become standard TSVs as the process continues.

Figure 4C:
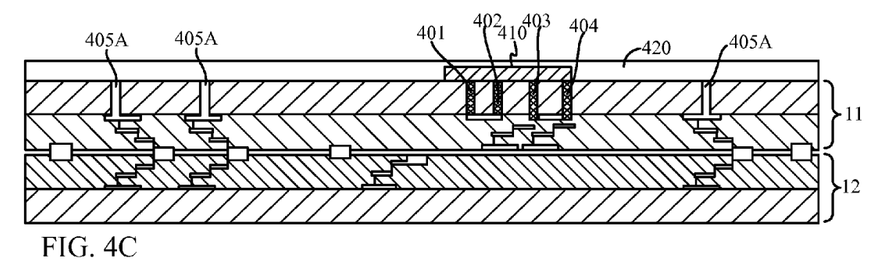

FIG. 4C shows the metallization of the uncovered locations 405A by metal layer 420 to create standard TSVs 405A. Copper or any desired metal can be used for this purpose consistent with other elements of the stacked IC device. Thus, as shown in FIG. 4C the uncovered locations now contain metal as shown at 405A, whereas the elements 401-404 remains protected and filled with sacrificial material.

Figure 4D:
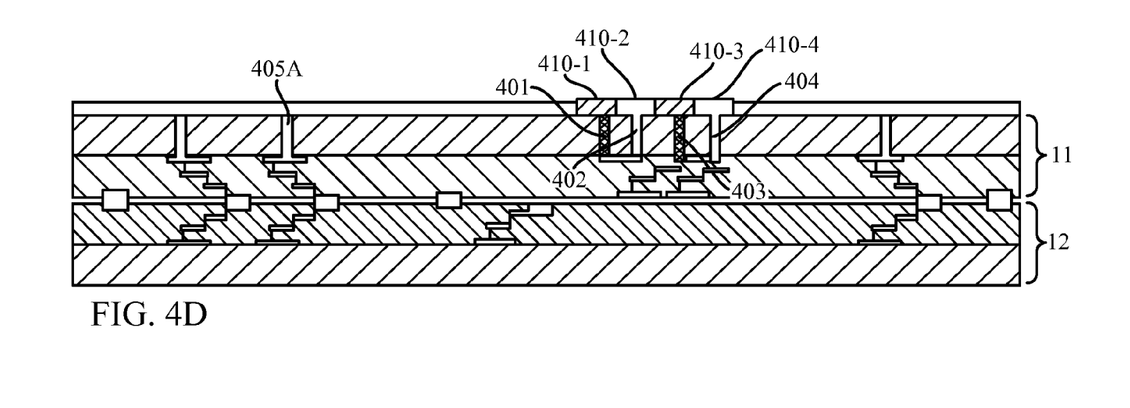

FIG. 4D shows the removal of portions 410-2 and 410-4 of protective material 410 leaving portions 410-1 and 410-3 in place. The sacrificial material within vias 402 and 404 is also shown removed.

Figure 4E:
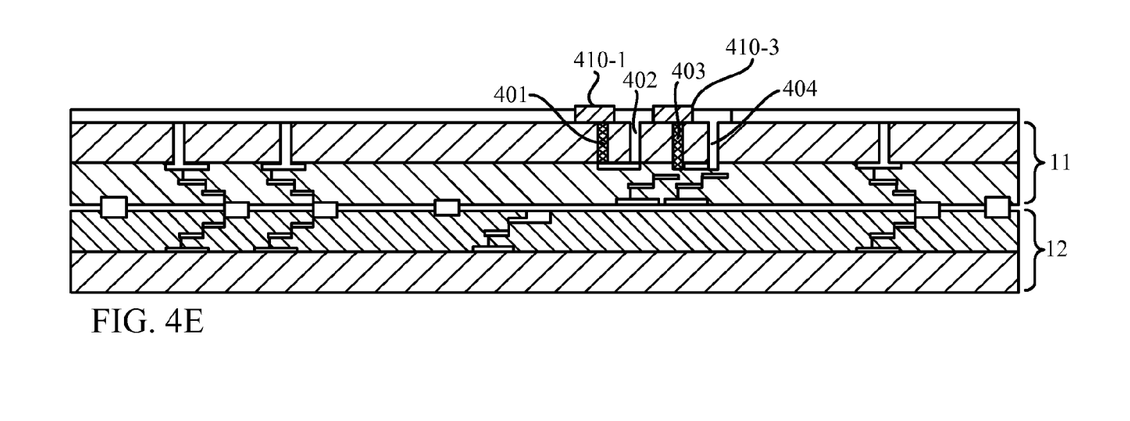

FIG. 4E shows P-type thermal electric material deposited within locations 402 and 404. The P-type material has not been deposited within locations 401 and 403 because these locations remain protected by portions 410-1 and 410-3 and thus still contain the sacrificial material.

Figure 4F:
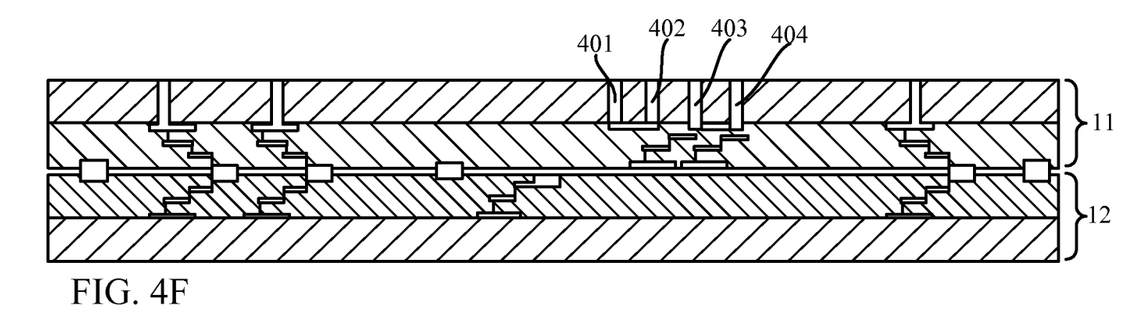

FIG. 4F shows the removal of portions 410-1 and 410-3 of protective material 410 to expose vias 401 and 403. The sacrificial material is then removed from vias 401 and 403.

Figure 4G:
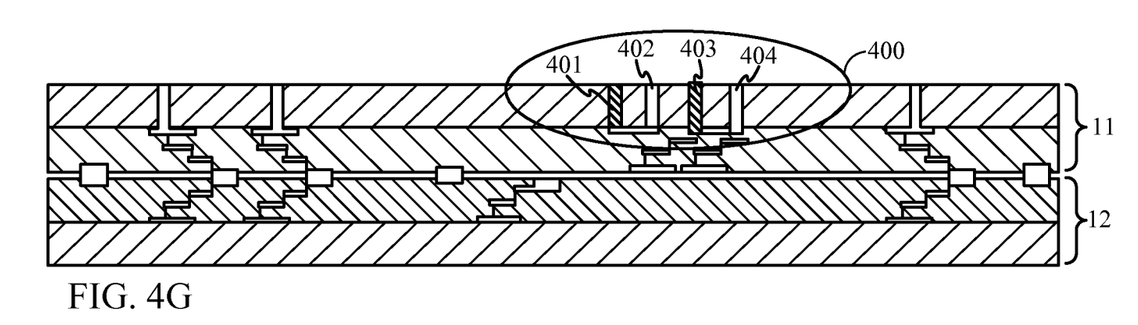

FIG. 4G shows N-type thermal material deposited in locations 401 and 403 thereby completing the formation of the temperature control device within layer 11. Typical materials for a Peltier device are bismuth telluride, Sb2Te3, PbTe and SiGe, but other materials, such as crystal-phonon glass or nano material, can be used as well. Also, it is possible to use two metals in a metal to metal junction such as Copper-Nickel. In this embodiment, Nickel fills the TSVs 401-404 and Copper is the standard metallization. Accordingly, every TSV 401-404 would be a potential Peltier device. There are two advantages of this Peltier structure. The first advantage is the masking steps for P and N type fill are removed. The second advantage is the density of the Peltier devices is increased as one side of the TSV 401-404 would act as the cooling point while the other side would be the heating side. Of course heat transport in the Z direction is improved while heat transfer in the X and Y direction becomes more difficult.

Although the description has shown the P-type material being deposited first and the N-type material subsequently being deposited, the order is not critical. That is, the N-type material could be deposited first if it is more convenient.

It should be pointed out that the temperature differential created by the circuit elements in the substrate can be used to drive a voltage. The voltage thus created can be scavenged, for example, to drive other circuit elements as shown by connection 320, FIG. 3 from control circuit 304. This would effectively reverse the operation of the TE device 300. The TE device 300 will cool the thermally troubled area (in FIG. 3 that would be hot spot 110) because heat energy is being removed from the hot spot by conversion into electrical energy. The net effect then would be that there would be no net cooling of the stacked IC device 30 as a whole (because energy is being returned to the stacked IC device 30 elsewhere) but there would be localized cooling at the "hot spot". Consequently, overall energy savings for the stacked IC device 30 results.

A Peltier device is a heat pump that requires energy to move heat from one point to another. As the disclosed embodiments have both points within the system, the heat energy is being moved from a point where it is difficult to remove (high thermal resistance) to a location where it is easer to remove so the heat is more uniformly distributed within the system. Thus, the total energy demand of the system is increased if the Peltier device is used to move the heat. Because the TE device can either remove or add heat depending upon current flow direction, a device could be used to selectively heat or cool the stacked IC device (or a portion thereof).

In one embodiment, the Peltier device is an energy scavenger: some of the heat generated by the stacked IC device operation can be recovered. The control system can switch the Peltier device to move heat from point A to point B (forward bias), or point B to point A (reverse bias) or scavenge heat from a temperature difference between points A and B to power the system. The energy balance of this TE system will depend on the efficiency of the Peltier device and the duty cycle of the system. Thus, the Peltier device can recover some energy from the overall system, based upon the temperature gradient within the system. In an embodiment in which more than two tiers exist, stacked Peltier devices can be provided to improve energy scavenging efficiency. For example, a cooling Peltier device could cool one tier, pumping heat to an adjacent tier. The adjacent tier could use the pumped heat to recover additional energy.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for controlling undesired temperature gradients in an integrated circuit (IC), the method comprising:
    allowing energy to flow between an area within a stacked integrated circuit (IC) and a thermal electric (TE) device, wherein the IC includes a tier having a substrate layer and an active layer in which active circuits are disposed, wherein the active layer is directly disposed on the substrate layer, and wherein the TE device is partially disposed within the substrate layer and partially disposed within the active layer; and
    enabling current to flow with respect to the TE device so as to selectively control the energy flow.

2. The method of claim 1, wherein the enabling comprises:
    providing current in a direction to the TE device to enable the TE device to remove heat from the energy flow.

3. The method of claim 1, wherein the enabling comprises:
    providing current in a direction to the TE device to enable the TE device to deliver heat to the energy flow.

4. The method of claim 1, wherein the enabling comprises:
    removing energy from the TE device to enable the TE device to deliver power to another element within the IC.

5. The method of claim 1, wherein the area within a stacked integrated circuit IC and the TE device are in different tiers of a multi-tiered IC device.

6. The method of claim 1, wherein the area within the stacked IC and the TE device is a thermally troubled area.

7. A method of removing heat from a hot spot in a multi-tiered integrated circuit (IC) device, the method comprising:
    allowing the heat from the hot spot to pass through the multi-tiered IC device from one tier to at least one other tier, wherein the at least one other tier includes a substrate layer and an active layer in which active circuits are disposed, wherein the active layer is disposed directly on the substrate layer, and wherein a thermal electric (TE) device is partially disposed within the substrate layer of the at least one other tier and partially disposed within the active layer of the at least one other tier; and
    enabling the TE device to transfer the heat out of the multi-tiered IC device.

8. The method of claim 7, wherein the enabling comprises: applying current to the TE device in a particular direction.

9. The method of claim 7, wherein the enabling comprises: removing energy from the TE device.

10. The method of claim 9, further comprising:
    applying the removed energy to at least one other element constructed within the multi-tiered IC device.

* * * * *